US 6,596,078 B2

(12) United States Patent
Konakahara et al.

(10) Patent No.: US 6,596,078 B2
(45) Date of Patent: Jul. 22, 2003

(54) METHOD OF PRODUCING OXIDE WHISKERS, OXIDE WHISKERS, AND PHOTOELECTRIC CONVERSION APPARATUS

(75) Inventors: Kaoru Konakahara, Kanagawa (JP); Hiroshi Okura, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/956,021

(22) Filed: Sep. 20, 2001

(65) Prior Publication Data

US 2002/0037249 A1 Mar. 28, 2002

(30) Foreign Application Priority Data

Sep. 21, 2000 (JP) ........................ 2000-287203
Sep. 11, 2001 (JP) ........................ 2001-275156

(51) Int. Cl.[7] ................................ C30B 9/02
(52) U.S. Cl. ........................ 117/75; 117/921
(58) Field of Search ................ 117/75, 921

(56) References Cited

U.S. PATENT DOCUMENTS

| 5,066,475 A | 11/1991 | Yoshinaka et al. | 423/622 |
|---|---|---|---|
| 5,279,809 A | 1/1994 | Kitano et al. | 423/622 |
| 6,228,502 B1 | 5/2001 | Saitoh et al. | 428/472 |
| 6,270,571 B1 | 8/2001 | Iwasaki et al. | 117/88 |

FOREIGN PATENT DOCUMENTS

| JP | 6597 | 1/1975 |
|---|---|---|
| JP | 120518 | 9/1981 |
| JP | 56-120218 | 9/1981 |
| JP | 56-120518 | 9/1981 |
| JP | 5529 | 2/1985 |
| JP | 252600 | 10/1989 |
| JP | 2-167900 | 6/1990 |
| JP | 2-175700 | 7/1990 |
| JP | 239300 | 9/1996 |
| JP | 316428 | 12/1998 |

OTHER PUBLICATIONS

Iwanaga, et al.; "A Note on the Orientation of ZnO Ribbon Crystal"; Japan J. Appl. Phys., vol. 11, (1972) 121–122.
Kitano, et al.; "Growth of Large Tetrapod–Like ZnO Crystals"; Jpn. J. Crystl. Growth, vol. 102 (1990) 965–973.
Satoh, et al.; "Epitaxial Growth of Zinc Oxide Whiskers by Chemical–Vapor Deposition Under Atmospheric Pressure"; Jpn. J. Appl. Phys. vol. 38 (1999) L 586–L589.
Pan, et al.; "Nanobelts of Semiconducting Oxides"; Science, vol. 291 (3–2001) 1947–1949.

*Primary Examiner*—Felisa Hiteshew
(74) *Attorney, Agent, or Firm*—Fitzpatrick, Cella, Harper & Scinto

(57) ABSTRACT

A method of producing oxide whiskers is provided which comprises heating a source material comprised of a metal or an inorganic compound at a first temperature to be vaporized and depositing a crystal constitutive material vaporized from the source material on a substrate heated at a second temperature lower than the first temperature.

27 Claims, 6 Drawing Sheets

METHOD OF PRODUCING OXIDE WHISKERS, OXIDE WHISKERS, AND PHOTOELECTRIC CONVERSION APPARATUS

BACKGROUND OF THE INVENTION

1. Field of the Invention

The present intention relates to acicular or needle-like oxide crystals (generally referred to as "oxide whiskers") and methods of producing the crystals. The present invention also concerns apparatus using the acicular oxide crystals (e.g., photoelectric conversion apparatus). Since the acicular oxide crystals have sharpness of their distal end, monocrystallinity, and large surface areas, they are expected to be applied in a variety of fields.

2. Related Background Art

Acicular crystals generally refer to monocrystalline bodies of an acicular shape having the diameter of not more than 100 μm and the ratio of length to diameter (aspect ratio) of not less than 10.

Japanese Patent Application Laid-Open No. 5-139900 (U.S. Pat. No. 5,279,809) describes a method of producing an acicular crystal of zinc oxide.

Specifically, a source material is prepared by adding powder of a tin-zinc alloy to zinc powder having an oxide film on the surface. The source material is put into a crucible and heated to be oxidized. After that, the source material is cooled down to room temperature. Acicular crystals are produced in the crucible in this way.

Although the acicular crystals were produced in the crucible by the technology described in the above application, the acicular crystals were unable to grow on a surface of a substrate located outside the crucible.

SUMMARY OF THE INVENTION

The acicular crystal powder was synthesized by the above method of heating metal to oxidize and aggregate in vapor phase, but it was infeasible to grow an acicular crystal film on a substrate by the method. It was possible to produce an oriented acicular crystal film by the atmospheric CVD technique using an organic source material, but this technique had problems that the substrate was limited to a sapphire substrate, the acicular crystal film obtained was limited to only that of ZnO having the diameter of about several μm, and cost was high because of use of the organic source material.

An object of the present invention is to provide a method of growing an acicular oxide crystal on a substrate, and photoelectric conversion apparatus using the acicular crystal produced by the method.

A method of producing acicular oxide crystals (i.e., oxide whiskers) according to the present invention is a method of producing acicular oxide crystals, comprising heating a source material comprising a metal or an inorganic compound at a first temperature to be vaporized and depositing a crystal constitutive material vaporized from the source material on a substrate heated at a second temperature lower than the first temperature.

The present invention is also characterized in that a source material comprising Zn as a main component is evaporated at the first temperature and transported onto the substrate located in an atmosphere containing oxygen, and acicular crystals of ZnO extending in the c-axis direction and having an average diameter of not more than 300 nm and aspect ratios of not less than 50 are formed on the substrate.

Particularly, it is preferable that a partial pressure of oxygen or a partial pressure of water vapor in the vicinity of the substrate be 100 to 10000 Pa and a temperature of the atmosphere in the vicinity of the substrate be 400 to 900° C.

It is also preferable that a pressure in the vicinity of the substrate be not less than 1000 Pa nor more than 100000 Pa.

A partial pressure of oxygen in the vicinity of the evaporating portion of the source material can be made lower than the partial pressure of oxygen in the vicinity of the substrate. The source material can be one having an average composition represented by $ZnO_x$, where $0 \leq X \leq 0.5$.

Here, the inorganic compound can be effectually selected from oxides, but it can also be selected from nitrides, chlorides, and so on (e.g., $TiCl_4$ and $FeCl_2$).

The acicular crystal in the present invention encompasses all of circular cylinders and circular cones, and variations thereof, e.g., truncated circular cones, circular cylinders with a sharp-pointed tip or with a truncated tip, and so on. Further, it encompasses triangular pyramids, rectangular pyramids, hexagonal pyramids, other polyhedral pyramids, those with a truncated tip; triangular prisms, rectangular prisms, hexagonal prisms, and other polyhedral prisms; or triangular prisms, rectangular prisms, hexagonal prisms, and other polyhedral prisms with a sharp-pointed tip or with a truncated tip; and polygonal structures thereof.

An electroconductive (hereinafter, simply referred to as "conductive") layer is preferably present on the surface of the substrate. The conductive film is sometimes effective when it is a transparent electrode. Preferred acicular oxide crystals are acicular crystals 70% or more of which stand with an axis thereof being not less than 60° relative to the substrate.

The acicular oxide crystals are effectively applied, particularly, to the photoelectric conversion apparatus.

A dye-sensitized photoelectric conversion device will be described below.

FIG. 10 is a cross-sectional view showing the schematic structure of a Graetzel-type photochemical cell using a dye-sensitized semiconductor electrode. In FIG. 10 numeral 44 designates a glass substrate, 45 a transparent electrode formed on a surface of the substrate, and 41 an anatase-type porous titanium oxide layer consisting of a porous joint body in which fine particles of titanium oxide are joined to each other. Numeral 42 designates a dye joined to surfaces of the titanium oxide particles, which acts as a light absorbing layer.

Numeral 43 denotes an electrolyte solution functioning as an electron donor, e.g., an electrolyte containing iodine (I). Light is injected into the cell from the left in the figure. The action of this solar cell is as follows. Namely, the incident light excites electrons in the dye and the electrons thus excited are efficiently injected into the titanium oxide semi-conductor layer. The dye in the oxidized state after the transmission of electrons quickly receives electrons from the electrolyte to be reduced into the original state. The electrons entering the interior of titanium oxide migrate between fine particles through the mechanism of hopping conduction or the like to reach the anode. Iodine ions in the electrolyte solution, oxidized because of the supply of electrons to the dye, are reduced at the cathode to return into the original state.

The dye can be selected, for example, from organic dyes and natural dyes such as perylene, rose bengal, Santaline, Cyanin, and so on, and metal complexes such as zinc porphyrin, ruthenium bipyridyl {Ru(dcbpy)$_2$(SCN)$_2$, (N3:dcbpy=2,2-bipyridine-4,4'-dicarboxylic acid)}, and so on, and it is important that oxidized and reduced forms thereof be stable. It is also necessary that potentials of excited electrons in the light absorbing layer, i.e., excitation levels of the photo-excited dye be higher than the level of the conduction band of the n-type layer.

DESCRIPTION OF THE PREFERRED EMBODIMENTS

Embodiments of the present invention will be described below.

First, a metal or an inorganic compound containing a source material for acicular oxide crystals is heated to a first temperature.

The first temperature herein is a temperature at which the foregoing metal or inorganic compound can be vaporized.

A substrate on which the acicular oxide crystals are to be grown is heated to a second temperature lower than the first temperature.

From the source material vaporized at the first temperature, acicular oxide crystals are grown on the substrate.

By vaporizing the source material in this way, acicular crystals are able to be formed on a desired substrate.

By setting the substrate temperature (the second temperature) lower than the first temperature, the vaporized source material can be deposited on the substrate to be grown into acicular crystals through an oxidation reaction.

The metal or inorganic compound containing the source material for acicular oxide crystals can be one selected from Zn powder and Ti powder having an oxide film on the surface, W, Mo, and so on.

The first temperature ($T_1$) can be a temperature higher than the temperature at which the source material is vaporized, e.g., in the range of 500° C. to 1000° C.

The second temperature ($T_2$) can be one satisfying the relation of $T_1>T_2$, e.g., in the range of not less than 400° C. but less than 1000° C. or in the range of 400° C. to 700° C.

The temperature difference between $T_1$ and $T_2$ is not less than 50° C., preferably not less than 100° C., and more preferably not less than 150° C.

The substrate can be selected, for example, from glass, a semiconductor such as Si, an oxide such as MgO or $Al_2O_3$ optionally having a conductive film formed on a surface thereof, a conductive film such as a metal film or especially a transparent conductive film (ITO, ZnO, $SnO_2$, etc,), a metal plate such as a stainless steel plate, or the like.

The invention will be described below in more detail.

Figure 1:
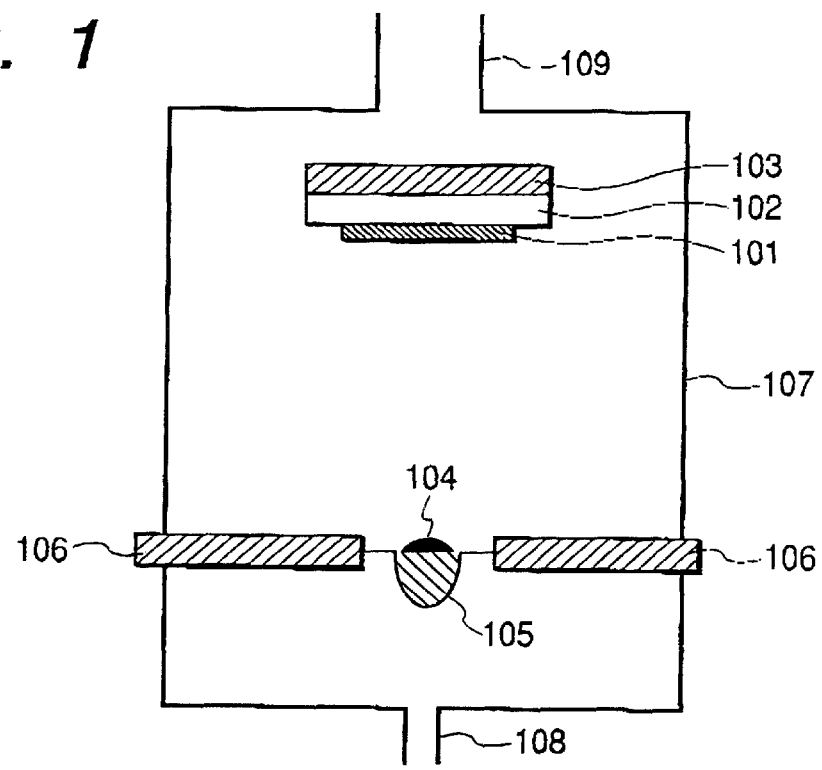
FIG. 1 is a schematic view of a production system of acicular oxide crystals provided with a crucible-type resistance heating mechanism.

In a system shown in FIG. 1, a crucible 105 being a resistance heating body is connected to electrodes 106 placed in a reactor 107. When the crucible 105 is heated at the first temperature by supplying an electric current thereto, the source material 104 in the crucible 105 is evaporated to deposit on a substrate 101 attached to a substrate holder 102 opposed to the source material. Gas is introduced through a gas inlet line 108 in the lower part of the reactor 107, rises in the reactor 107, and then is discharged through a gas exhaust line 109 in the upper part of the reactor 107. A substrate heater 103 is disposed on the back of the substrate holder 102 so as to be able to keep the substrate 101 at an adequate temperature (the second temperature). The second temperature is set lower than the first temperature.

For growing acicular crystals on the substrate 101, a carrier gas and an oxidizing gas are first introduced through the gas inlet line 108 to retain the interior of the reactor 107 under an adequate pressure. At this time the carrier gas is preferably an inert gas, e.g., He, Ar, or nitrogen. The oxidizing gas is preferably oxygen. Air can also be used as the oxidizing gas. The pressure inside the reactor 107 is normally about 100 to 100,000 Pa. Then, the substrate temperature is set to a temperature suitable for the acicular crystals by the substrate heater 103. It is preferable to place a thermocouple near the substrate 101 though not shown. The substrate temperature is selected in the range of several hundred ° C. to 1000° C. though it depends upon the oxide to be grown, and the pressure. Then, the electric current is made to flow through the electrodes 106 to heat the crucible 105 with the source material 104 therein.

This crucible 105 is normally an alumina crucible to which a tungsten wire is joined. It is also preferable to place a thermocouple near the crucible 105 so as to permit control of the temperature of this crucible 105. After the crucible 105 is heated so as to start evaporating the source material 104, the vapor is entrained in the ascending current toward the substrate 101 to deposit thereon. In general, oxidation of the source material proceeds in the process from the evaporation to the deposition. The progress in oxidation is dependent upon the type of the source material, the pressure, the concentration of oxygen, the temperature, and so on.

With the pressure being high or with the amount of the evaporated source material being particularly large, the fine particles of oxide or acicular oxide crystals can grow during the transition to the substrate in certain cases.

Figure 5A:
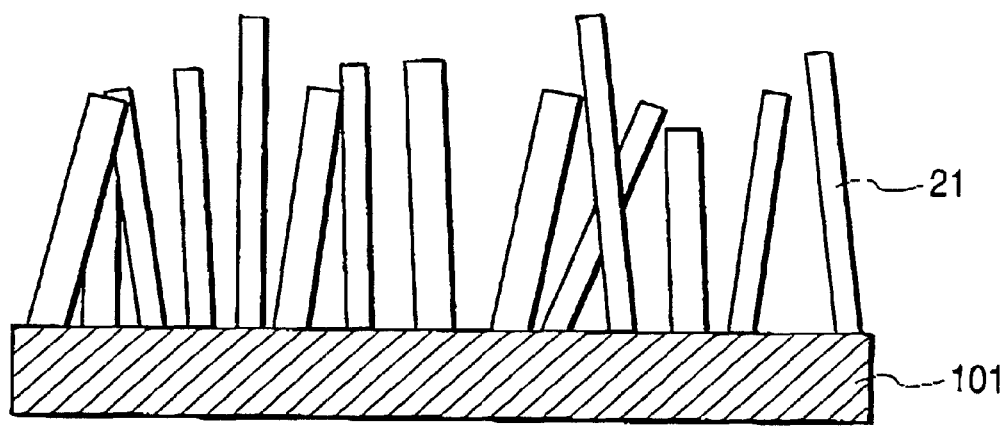
FIG. 5A is a schematic view of acicular oxide crystals grown as orientated on a substrate.
Figure 5B:
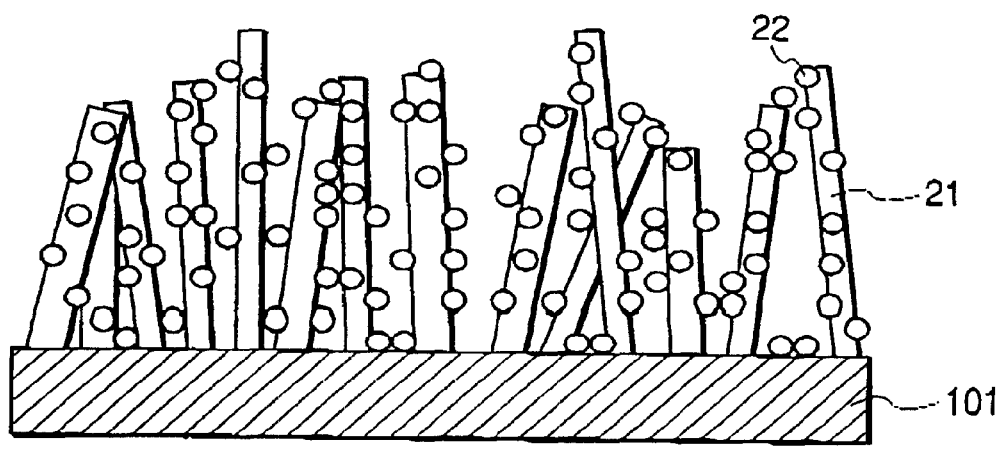
FIG. 5B is a schematic view of acicular oxide crystals grown as oriented on a substrate and having ultrafine particles dispersed thereon.

In the growth of acicular crystals on the substrate, the acicular crystals 21 grow in a standing state on the substrate 101, as shown in FIG. 5A. In the cases wherein oxidation and aggregation occurs in the vapor phase before arrival at the substrate 101 as described above, fine oxide particles 22 in a dispersed state are obtained together with the acicular crystals 21, as shown in FIG. 5B. In application intended for a large surface area, this growth of fine oxide particles 22 is advantageous in certain cases. In such cases, it is preferable to control the evaporation amount of the source material, the pressure inside the reactor, etc. so as to make particle diameters of the fine oxide particles not less than 1 nm nor more than 100 nm.

To form unevenness or seed crystals on the surface of the substrate is effective in controlling the growth positions, density, and direction of the acicular crystals.

Figure 6A:
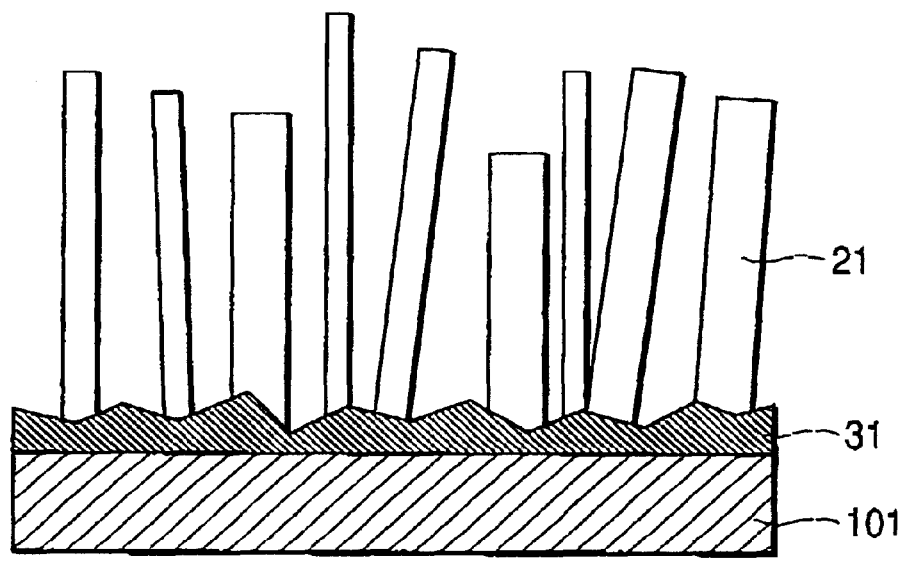
FIG. 6A is a schematic view of acicular oxide crystals grown from a substrate having an unevenness portion thereon, and FIG. 6B a schematic view of acicular oxide crystals grown from a substrate having seed crystals thereon.

When unevenness 31 with level differences comparable to the diameters of the acicular crystals 21 is formed in the surface of the substrate 101, as shown in FIG. 6A, the acicular crystals are able to grow in a higher density than on a flat substrate.

The unevenness can be formed by etching of the substrate surface or by forming a thin film having the desired unevenness on the substrate 101.

The size of the unevenness is preferably 5–500 nm in a vertical direction and 10–500 nm in a horizontal direction.

The foregoing thin film is, for example, a textured, F-doped $SnO_2$ transparent conductive film.

Figure 6B:
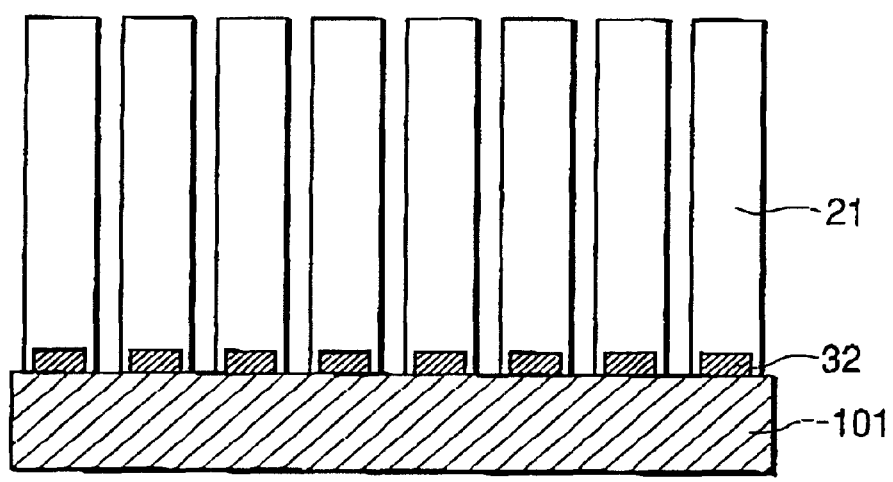

When the seed crystals 32 are formed as shown in FIG. 6B, the acicular crystals become easier to grow from the seed crystals 32. On this occasion, the seed crystals 32 are preferably of a material having the same crystal structure as the acicular crystals to be grown. It is a matter of course that the seed crystals are preferably made of the same material as the acicular crystals. Here, the orientation of the seed crystals is preferably aligned with the orientation in which the acicular crystals are easy to grow. For example, it is the c-axis direction in the case of ZnO.

The seed crystals 32 may be made by the common photolithography process. Other effective methods are a method of dispersing fine particles or the like over the substrate surface, and a method of making the seed crystals by electrodeposition.

In the present invention, when the acicular crystals are applied to devices such as the photoelectric conversion apparatus and electron 10 sources, it is preferable to grow the acicular crystals on a conductive material. The conductive material includes, for example, ZnO doped with Ga or Al, $SnO_2$ doped with F or Sb, and ITO. The acicular crystals used in the foregoing devices are preferably those having the diameter of not less than 5 nm nor more than 10 $\mu$m and the aspect ratio of not less than 10. It is preferable that the acicular crystals satisfying this condition exist at a rate of 70% or more of the total. It is also preferable that 70% or more acicular crystals stand with the axis thereof being not less than 60° relative to the substrate.

Particularly, in the case of application wherein light is transmitted through the back side of the acicular crystal film as in the photoelectric conversion apparatus, the conductive layer is preferably a transparent electrode.

The heating device for vaporizing the source material can be either one selected from the following devices.

Figure 2:
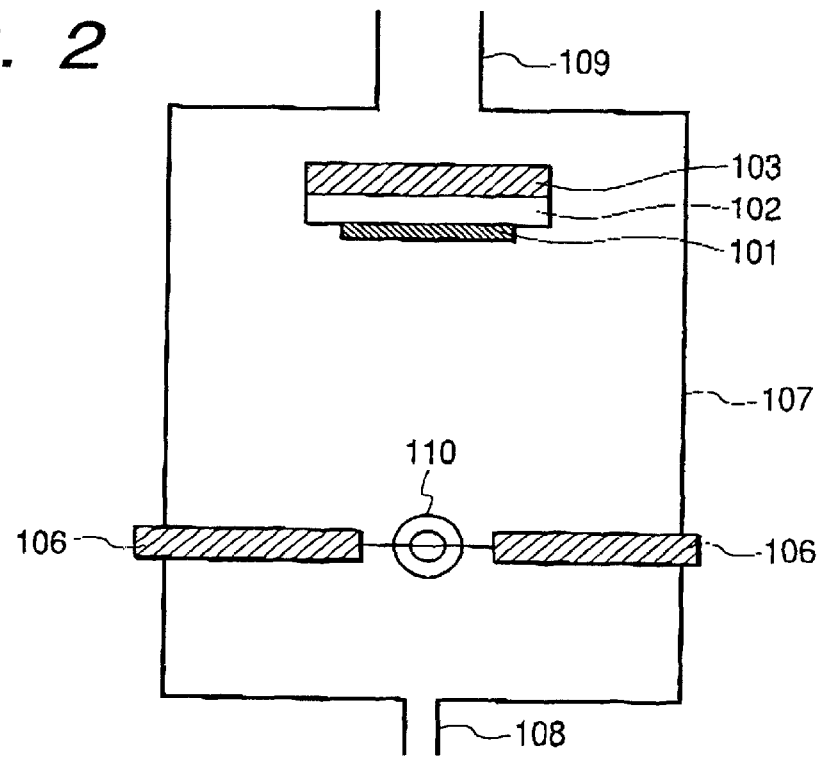
FIG. 2 is a schematic view of a production system of acicular oxide crystals provided with a filament-type resistance heating mechanism.

For the heating, a filament 110 can also be used as shown in FIG. 2. In this case, it is also possible to employ a configuration wherein the filament 110 itself is the source material. This configuration is advantageous, because it may be difficult to evaporate the source material in the crucible 105, particularly where the source material is tungsten (W) or molybdenum (Mo) as a high-melting metal.

Figure 3:
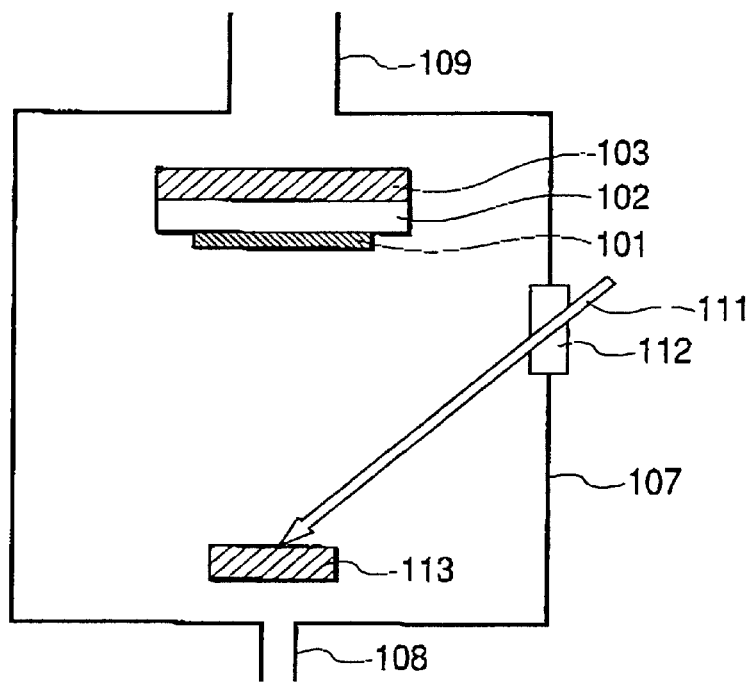
FIG. 3 is a schematic view of a production system of acicular oxide crystals provided with a laser evaporating mechanism.

As shown in FIG. 3, a laser evaporation method can also be used for vaporization of the source material. The laser can be selected, for example, from $CO_2$ lasers, YAG lasers, excimer lasers, and so on. The source material is set as a target 113 and a laser beam 111 is guided through laser port 112 onto the target 113 whereby the source material can be evaporated. This method is superior in controllability of the evaporation amount.

Figure 4:
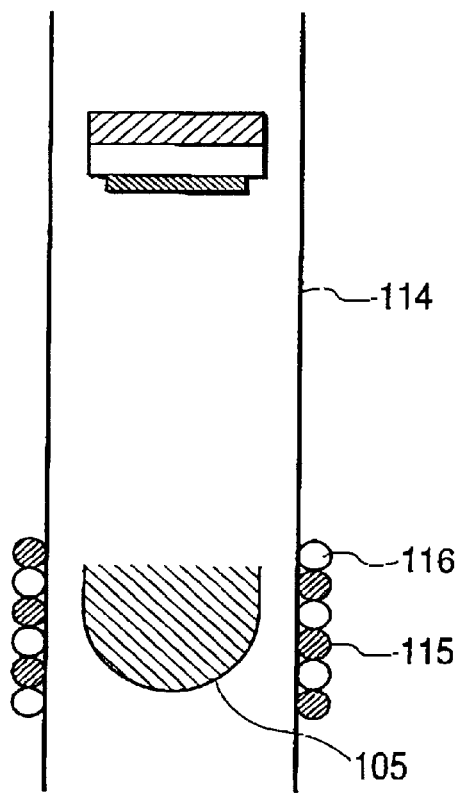
FIG. 4 is a schematic view of a production system of acicular oxide crystals provided with an induction heating mechanism.

A high-frequency induction heating mechanism can also be used as shown in FIG. 4. Since the induction heating mechanism includes no metal electrodes in the heating part as in the case of the laser evaporation method, it is advantageous in use under conditions where the electrodes are readily oxidized. When a high-frequency electric current is made to flow in coil electrode 115 for induction heating from the outside of reactor tube 114, the source material of metal in the crucible 105 is heated to be evaporated. A water cooling tube 116 for cooling is located near the electrode 115. Gas flows from the lower part to the upper part in the figure, so that the source material evaporated is deposited on the substrate.

A preferred form, particularly, for production of acicular ZnO crystals will be described below.

Figure 8:
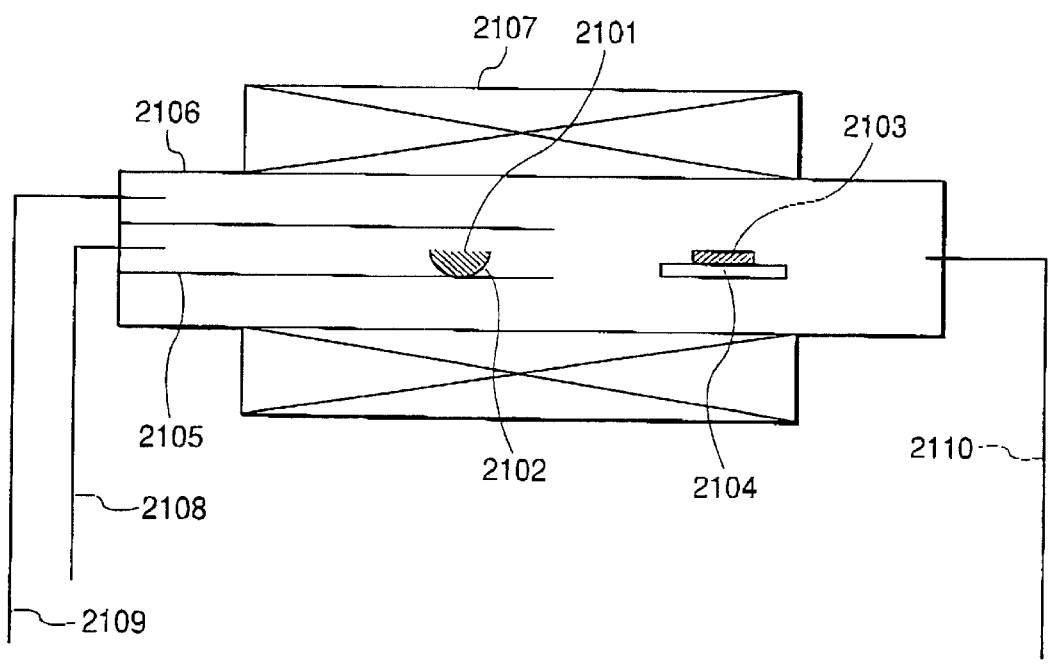
FIG. 8 is a schematic view showing a system used for growth of acicular crystals.

FIG. 8 shows an example of acicular crystal growing apparatus used in the present invention. In FIG. 8, numeral 2101 designates a source material, 2102 a receptacle for the source material to be put therein, 2103 a substrate on which the acicular ZnO crystals are grown, 2104 a substrate holder, 2105 an inside reaction tube, 2106 an outside reaction tube, 2107 an electric furnace, 2108 a gas inlet line A for introducing a reducing gas or the like, 2109 a gas inlet line B for introducing an oxidizing gas or the like, and 2110 a gas exhaust line. Although not shown, in addition to this structure, the system is further provided with a heating mechanism for heating the substrate holder, an evacuation system for evacuating the interior of the system, a control unit for controlling the temperature, a thermocouple for monitoring the temperature, and so on.

First, powder of the source material comprising Zn as a main component or the like is charged in an appropriate amount into the receptacle 2102 of the reactor and the substrate 2103 is placed. After that, the entire reactor is evacuated through the gas exhaust line 2110. Then, gas such as nitrogen gas or the like is introduced through the gas inlet line 2108 to set the reactor to about 1 atm. After that, a carrier gas such as nitrogen gas or the like is introduced at a rate of several mL/min to several L/min through the gas inlet line A 2108 and a carrier gas such as nitrogen containing an oxidizing gas such as oxygen or the like is introduced at a rate of several mL/min to several L/min through the gas inlet line B 2109. Then, the gas is discharged through the gas exhaust line 2110 while the entire reactor is retained under about 1 atm. Since the inside reaction tube 2105 exists, the gases introduced through the respective gas inlet lines A and B are mixed just before the substrate 2103, and the atmosphere in the vicinity of the source material is close to the atmosphere of the gas introduced through the gas inlet line A.

The gas introduced through the gas inlet line B contains a larger concentration of oxygen than the gas introduced through the gas inlet line A, whereby the oxygen atmosphere in the substrate area call be higher than the oxygen atmosphere in the heating area of the source material. Namely, it becomes feasible to control the oxygen concentration optimal for the evaporation of the source material and the oxygen concentration optimal for the growth of ZnO on the substrate. In this case the oxygen concentration is preferably not more than 5000 Pa.

The substrate temperature is set at 550° C. and the electric furnace is activated to keep the temperature of the source material at about 700° C., thereby evaporating the source material.

After the reaction is carried on for several minutes to several hours, the temperature is lowered and the substrate 2103 is taken out.

The source material herein can be selected from various materials comprising Zn as a main component, but a particularly preferred material is $ZnO_x$ ($0 \leq x \leq 0.5$); in particular, it is preferable to use fine particles of Zn with an oxidized surface. By heating this source material at the temperature of not less than 600° C. nor more than 800° C., it becomes feasible to transport the source material in an appropriate evaporation amount to the substrate.

The substrate can be selected according to the purpose from materials resistant to the heating without any specific restrictions. For example, the substrate can be selected from glasses, semiconductor substrates such as Si and the like, single crystals of oxides such as MgO, sapphire, and the like, or sintered substrates, and, of course, the substrate may be one provided with a conductive layer thereon. It is a matter of course that the shape of the substrate is not limited to the plate-like shape but may be the cylindrical shape or the tape shape like Kapton.

The atmosphere in the vicinity of the substrate is preferably one in which the partial pressure of oxygen or the partial pressure of water vapor is 100 to 10000 Pa. Reasons are as follows: if the oxygen atmosphere is too high oxygen will cause influence including oxidation of the source material before evaporation; and if the oxygen atmosphere is too low oxygen will be short on the occasion of growth of crystals of ZnO. The temperature of the gas atmosphere above the substrate is approximately 400 to 900° C. and is preferably a little higher than the substrate temperature. The total pressure is preferably not less than 1000 Pa nor more than 100000 Pa.

In order to grow the acicular ZnO crystals of the present invention on the substrate with high controllability, it is preferable to preliminarily provide initiation sites for growth of crystals on the substrate. A preferred method with this action of the initiation sites is a method of providing the seed crystals of ZnO on the substrate, particularly, as shown in FIG. 6B. This is preferably a method of growing the seed crystals of ZnO on the substrate by electroplating or by electroless plating, for example. In this plating method the c-axis direction of ZnO readily becomes normal to the surface of the substrate and this is convenient for the growth of ZnO whiskers long along the c-axis in the normal direction from the substrate.

In addition to the seed crystals, the unevenness in the substrate surface as shown in FIG. 6A can be ZnO-growing nuclei. In this case, the size of the unevenness is one in which level differences (i.e., differences of elevation) thereof are several ten to several hundred nm. This unevenness can be made by a step of roughening the substrate surface by polishing or etching, or the unevenness may also be unevenness of a film obtained by a film forming process such as the CVD process or the like.

In order to grow the ZnO whiskers having the sizes of several ten to several hundred am in a high density, the surface density of the initiation sites for the growth of crystals is preferably not less than $10^8/cm^2$ and not more than $10^{12}/cm^2$.

Figure 9:
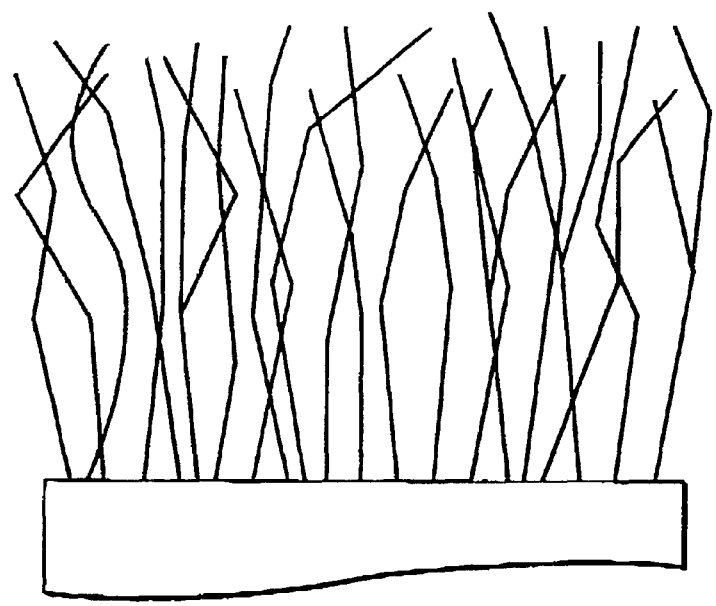
FIG. 9 is a schematic cross-sectional view of acicular ZnO crystals.
Figure 10:
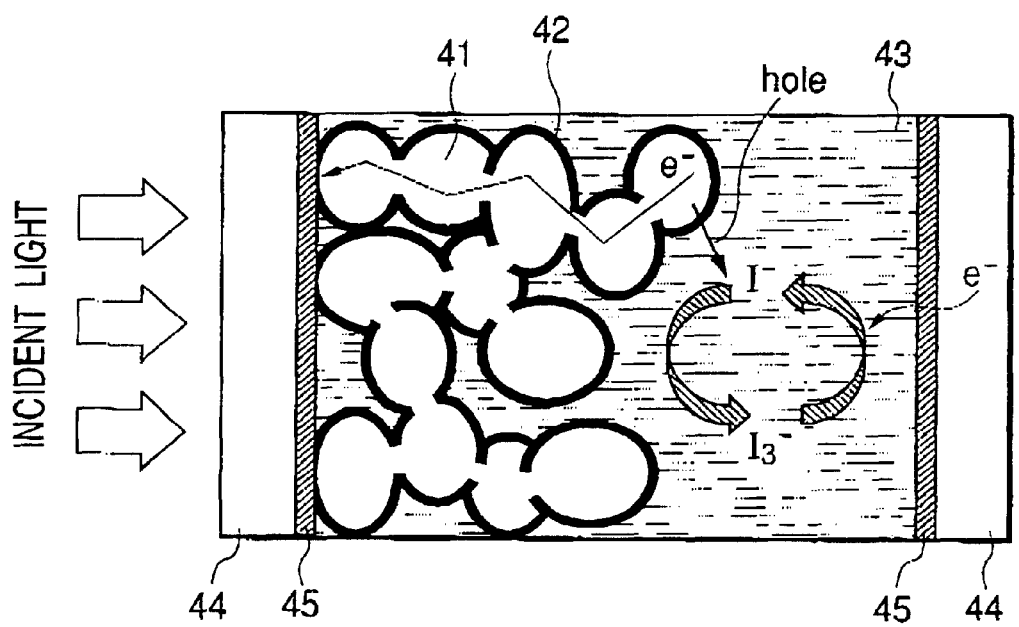
FIG. 10 is a cross-sectional view showing a Graetzel cell.

The acicular ZnO crystals obtained in this way do not always include only the linear acicular crystals, but can also include acicular crystals with branched portions or bent portions as shown in FIG. 9, depending upon conditions.

The acicular ZnO crystals formed by the above-stated method are effective, particularly, in use as the Graetzel dye-sensitized semiconductor electrodes. The reason is as follows. In common Graetzel cells, in order to compensate for an insufficient light absorption rate of a single dye layer, a porous film obtained by sintering fine particles is used so as to increase the surface area, thereby increasing the substantial light absorption quantity. This method is simple, but involves a problem that migration of electrons is not efficient enough in the n-type layer or in the p-type layer. For example, in the foregoing Graetzel cells, when incidence of light from the transparent electrode side with the film of fine $TiO_2$ particles is compared with incidence of light from the other electrode side, the former often demonstrates higher photoelectric conversion efficiency. This does not suggest only the difference between light absorption quantities merely due to the dye, but also suggests that the probability that electrons excited by light absorption migrate between fine particles of $TiO_2$ to reach the transparent electrode decreases with distance of the photoexcitation position from the transparent electrode. In the case of the electrolyte being also used in the p-type layer, diffusion of ions of iodine or the like becomes a rate-determining factor and there will arise a problem that charge cannot be transported well with increase in the electric current. When the p-type layer is solid, it is difficult to fill spaces between the fine particles sufficiently with the p-type layer.

In the case of the acicular crystals of the present invention, the ZnO whiskers are slender and the aspect ratios thereof are large. Therefore, the surface area is large even in the monocrystalline state.

In order to increase the surface area further, it is also effective to deposit the fine particle layer on the whisker surfaces.

Since clearances are relatively linear, they can be conveniently filled with the electrolyte functioning as a p-type layer or with a p-type semiconductor.

Namely, in the case of the electrolyte, the iodine ions or the like diffuse fast and also permeate fast on the occasion of production. In the case of the p-type layer being a solid like CuI, it is advantageously feasible to fill the porous n-type layer to a far depth quickly during the production.

When the ZnO whiskers of the present invention are applied to the photoelectric conversion elements, it is particularly preferable to employ the acicular ZnO crystals having the minimum diameter of the acicular crystals of not more than 50 nM and the aspect ratio of not less than 100. Such thin and long acicular crystals can be effectively made by setting the substrate at a slightly high temperature, preferably, about 550° C. It is also preferable that 70% or more of the acicular crystals stand at angles not less than 60° relative to the substrate. This is because the acicular crystals can be made in high density and it facilitates the permeation of the p-type layer.

When the present invention is applied to devices in which an electric current is made to flow in the acicular ZnO crystals, it is rather preferable to place a conductive layer on the substrate surface. Particularly, when the present invention is applied to the photoelectric conversion elements, the substrate and the conductive layer on the substrate surface are preferably transparent. In this case, ITO, or tin oxide or zinc oxide doped in the n-type can be effectively utilized as the conductive layer.

In the present intention, methods available for heating the source material can be the resistance heating method, the laser ablation method, the induction heating method, etc., in addition to the common electric furnace.

EXAMPLES

The present invention will be described below in more detail with examples thereof.

Example 1

An example of producing the acicular ZnO crystal film with the acicular crystal (whisker) production system of FIG. 1 will be described below.

First, Zn powder with an oxidized surface was charged as source material 104 into the alumina crucible 105 attached to a tungsten (W) wire, to be connected to the electrodes 106. An alumina substrate having a thickness of 0.5 mm was used as the substrate 101 and its temperature was set to 600° C. Then, argon gas with 10% oxygen mixed was made to flow at the rate of 50 mL/min (sccm) in the reactor 107 to be retained at 60000 Pa. Then, the crucible 105 was heated to the temperature of 950° C. to gradually evaporate Zn for about 60 minutes.

The film produced was observed with FE-SEM (field emission-scanning electron microscope) and it was verified from the observation that many oriented acicular crystals (whiskers) of ZnO were formed on the substrate, as shown in FIG. 5A. They were grown with their crystallographic axes at angles of not less than 60° relative to the substrate. Diameters of the acicular crystals were several hundred nm near the roots of the crystals and the acicular crystals became thinner toward the distal ends thereof. Lengths of the acicular crystals were several $\mu$m to several ten $\mu$m. The acicular crystals tended to grow a little thicker and longer with increase in the temperature of the crucible.

In the next place, the gas pressure was varied while the temperature of the crucible was fixed at 950° C. The reaction period was 60 minutes as above. As a result, the diameters of the acicular crystals produced under the gas pressure of 100 Pa were several ten nm and tended to increase with increase in the gas pressure.

As described above, the acicular crystals grown as oriented on the substrate were able to be produced by the production method of the present invention. It was also feasible to control the diameters of the acicular crystals by adjusting the evaporation temperature or the reaction pressure.

Example 2

An example of producing acicular crystals of $WO_3$ or $MoO_3$ with the acicular crystal production system of FIG. 2 will be detailed below.

First, a wire of W or Mo having the diameter of 1 mm was shaped into a convolute filament in the diameter of 15 mm and was connected to the electrodes 106 in the resistance heating mechanism. A Pt substrate having a thickness of 0.2 mm was used as the substrate 101 and was set to 800° C. The argon gas with 0.01% oxygen mixed was introduced at the rate of 50 mL/min (sccm) into the reactor 107 to be maintained at 10000 Pa. The temperature in the vicinity of the filament was raised to 600–1000° C. to gradually evaporate the filament for about ten minutes.

The films produced were observed with FE-SEM and it was verified from the observation that many oriented acicular crystals of $WO_3$ or $MoO_3$ were formed on the substrate 101, as shown in FIG. 5A, and were grown with their crystallographic axes at angles of not less than 60° relative to the substrate, but there were a few acicular crystals lying down. Diameters of the acicular crystals were several ten nm and lengths thereof were several $\mu$m. There was such a tendency that the acicular crystals were grown a little thicker and longer with increase in the temperature in the vicinity of the filament. When the temperature was low near the filament, fine particles of the material evaporated from the filament and condensed in the vapor phase were deposited in a dispersed state among the acicular crystals and on the surface as shown in FIG. 5B. Particle diameters of the fine particles were about several ten nm.

Then, the gas pressure was varied while the temperature in the vicinity of the filament was fixed at 1000° C. The reaction period was ten minutes as above. As a result, sizes of the acicular crystals produced under the gas pressure of 100 Pa were several nm and those under the gas pressure of 60000 Pa were several hundred nm.

As described above, the acicular crystals grown as oriented were able to be produced on the substrate by the production method of the present invention. It was also feasible to control the sizes of the acicular crystals by adjusting the evaporation temperature or the reaction pressure. The acicular crystals were also able to be produced in the state in which the fine particles were dispersed on the acicular crystals.

Example 3

A production method of acicular oxide crystals by the laser evaporation method will be described below.

Acicular crystals of $TiO_2$ were produced using the system shown in FIG. 3. In the figure numeral 111 designates the laser beam, 112 the laser port for letting the laser beam 111 enter the reactor 107, and 113 the target obtained by solidifying Ti powder with an oxidized surface. In the present invention, the laser beam is a second higher harmonic of YAG, having the pulse width of 10 ns, the energy per pulse of 0.7 J (joule), and the pulse repetition frequency of 10 Hz.

The interior of the reactor 107 was retained so that the partial pressure of Ar was 10000 Pa and the partial pressure of oxygen was 10 Pa, the Ti substrate 101 was heated to 700° C. and the Ti target 113 was exposed to the laser for 30 minutes, thereby growing the acicular crystals of $TiO_2$ on the Ti substrate 101 opposed to the target 113. When exposed to the laser, the Ti target was heated to about 2000° C.

The sample thus produced was observed with FE-SEM and it was verified from the observation that acicular crystals of rutile $TiO_2$ were formed on the substrate, as shown in FIG. 5A, and were mainly grown with their crystallographic axes at angles of not less than 60° relative to the substrate.

Example 4

An example with unevenness formed in the substrate surface will be described below referring to FIG. 6A.

An F-doped tin oxide film was deposited in a thickness of about 500 nm on a glass substrate by the CVD method. The resultant film functioned as a transparent, conductive film having the sheet resistance of about 10 $\Omega/\square$ and the surface unevenness 31 with level differences of about 100 nm was formed in the surface, as shown in FIG. 6A. Using this as a substrate, acicular crystals of $SnO_2$ were formed by a method similar to that in Example 1. However, the source material was Sn instead of Zn, different from Example 1. The cycle of the unevenness was approximately 2 to 3 times the level difference.

For comparison's sake, crystals of $SnO_2$ were also grown on a flat Si substrate with an oxidized surface by a similar method.

The samples obtained were observed with FE-SEM and it was verified that the acicular crystals were grown on the tin oxide film with the unevenness therein in the density about ten times larger than on the Si substrate with the oxidized surface. This tells us that the density of acicular crystals is able to be controlled by the surface unevenness. The unevenness is preferably in the range of about several hundred nm and more preferably approximately equal to the diameters of whiskers to be grown.

Example 5

An example of application in which the acicular crystals formed over the unevenness in the substrate surface are applied to the photoelectric conversion apparatus will be described below with reference to FIG. 6A.

An F-doped tin oxide film was deposited in the thickness of about 500 nm on a glass substrate by the CVD method. The resultant film functioned as a transparent, conductive film having the sheet resistance of about 10 Ω/□ and the surface unevenness 31 with level differences of about 100 nm was formed in the surface of the substrate, as shown in FIG. 6A. Using it as a substrate, acicular crystals 21 of ZnO were formed by a method similar to that in Example 1.

For comparison's sake, ZnO crystals were also grown on a flat Si substrate with an oxidized surface by a similar method.

The samples obtained were observed with FE-SEM and it was verified that acicular crystals were grown on the tin oxide film with the unevenness therein in the density about ten times greater than that on the Si substrate with the oxidized surface. This teaches us that the density of acicular crystals is also able to be controlled by the surface unevenness in the case of the acicular crystals of ZnO.

Then, a dye-sensitized photoelectric conversion device was fabricated in the following manner using the acicular crystals of ZnO thus produced. Eosine Y as a dye was dissolved in ethanol and the acicular crystals of ZnO were dipped therein for 30 minutes to make the electrode adsorb the dye (which will act as a light absorbing layer), followed by drying at 80° C. The counter electrode was one obtained by depositing platinum in the thickness of 1 nm on a conductive glass (F-doped $SnO_2$, 10 Ω/□) by sputtering, and the redox pair used was $I^-/I^{31}$. A mixture was used in such a composition that the solute was tetrapropylammonium iodide (0.46 mol/L) and iodine (0.06 mol/L) and the solvent was ethylene carbonate (80 vol %) and acetonitrile (20 vol %). This mixture was dropped onto the acicular crystals of ZnO and the counter electrode was placed opposite to the crystals to form a cell.

Figure 7:
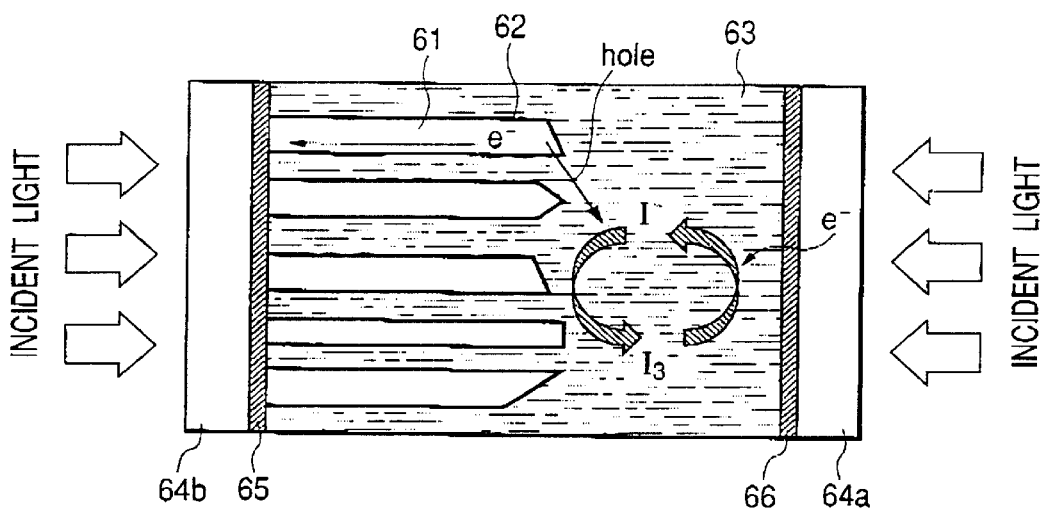
FIG. 7 is a view showing a configuration example of the photoelectric conversion apparatus according to the present invention.

FIG. 7 is a view showing a configuration example of the photoelectric conversion apparatus according to the present invention. In FIG. 7, symbol 64a denotes a glass substrate provided with a transparent electrode layer (cathode) 66 on a surface thereof, 61 acicular crystals with a light absorbing layer 62 formed on surfaces thereof, 63 an electrolyte solution serving as a charge transport layer, and 64b a glass substrate provided with a transparent electrode layer (anode) 65 on a surface thereof. The acicular crystals 61 function as one charge transport layer and the light absorbing layers 62 are disposed between this charge transport layer and the charge transport layer 63.

A similar cell was also produced using powder of acicular crystals of ZnO as a comparative example The cells thus produced were exposed to light from a xenon lamp of 100 W equipped with a UV cut filter. Measurement was conducted to measure values of photocurrent due to photoelectric conversion reaction occurring at this time, and the cell according to the present invention demonstrated the short-circuit current and fill factor both 10% or more greater than those of the cell of the comparative example. Accordingly, it is seen that the acicular crystals produced by the method according to the present invention are effectively applicable to the photoelectric conversion apparatus. The present example was described as an example of application in which the acicular crystals were applied to the photoelectric conversion apparatus, but it should be noted that the acicular crystals were also able to be utilized for STM (Scanning Tunneling Microscopy), AFM (Atomic Force Microscope) probes, electron emitting materials, light emitting materials, antistatic materials, photocatalysts, humidity sensors, and so on.

Example 6

An example with seed crystals formed on the substrate surface will be described below referring to FIG. 6B.

A Pt film and a ZnO film were deposited each in the thickness of about 100 nm on a glass substrate by sputtering. Here, the Pt film functions as an underlying layer for ZnO. Only the ZnO film was processed to the size of about 200 nm by the photolithography process to form the seed crystals 32 as shown in FIG. 6B. Using the resultant as a substrate, acicular crystals of ZnO were formed by a method similar to that in Example 1.

The sample obtained was observed with FE-SEM and it was verified from the observation that the acicular crystals were grown in a density close to that of the seed crystals and in the direction aligned with the orientation of the seed crystals. This verifies that the density of the acicular crystals and the direction of growth are able to be controlled by the seed crystals.

The dye-sensitized photoelectric conversion apparatus was also produced in the same manner as in Example 5, using the acicular crystals of ZnO thus obtained.

A similar cell was also produced using powder of acicular crystals of ZnO as a comparative example.

The cells thus produced were exposed to light from the xenon lamp of 100 W equipped with the UV cut filter. The measurement was conducted to measure values of photocurrent due to the photoelectric conversion reaction occurring at this time and it was verified from the measurement that the cell of the present invention demonstrated the short-circuit current and fill factor both 15% or more greater than those of the cell of the comparative example. Accordingly, it is seen that the acicular crystals produced by the method of the present invention are effectively applicable to the photoelectric conversion apparatus.

The acicular oxide crystals and the production methods thereof according to the present invention can be applied in many fields including electrochromic devices, electron sources, etc., in addition to the above-stated devices.

Example 7

The present example is an example in which acicular crystals of ZnO are produced under various conditions, which will be described referring to FIG. 8. FIG. 8 shows the system for growing the acicular crystals of ZnO, in which numeral 2101 designates the source material, 2102 the receptacle for receiving the source material, 2103 the substrate on which the acicular crystals of ZnO are to be grown, 2104 the substrate holder, 2105 the inside reaction tube, 2106 the outside reaction tube, 2107 the electric furnace, 2108 the gas inlet line A for introducing the reducing gas or the like, 2109 the gas inlet line B for introducing the oxidizing gas or the like, and 2110 the gas exhaust line.

First, fine particles of $ZnO_x$ with an oxidized surface were prepared according to the following procedures. 1 mL of distilled water was added to 5 g of 200-mesh Zn powder, they were mixed well in a mortar, and thereafter the powder was air-dried, thereby obtaining $ZnO_x$. At this time "x" was about 0.1. Then, this $ZnO_x$ powder was annealed at 100 to 500° C. in the electric furnace to adjust x to 0.1 to 1.0. First, 0.5 g of the source powder having x of about 0.2 was charged into the receptacle 2102 of the reaction system shown in FIG. 8, a sintered alumina substrate was set as the substrate 2103, and thereafter the entire reaction chamber was evacuated down to 1 Pa or less through the gas exhaust line 2110.

Then, nitrogen gas was first introduced through the gas inlet line 2108 to control the interior of the chamber to 1 atm. Then, nitrogen was introduced at the rate of 100 mL/min through the gas inlet line A 2108 and nitrogen gas containing oxygen 1% at the rate of 100 mL/min through the gas inlet line B 2109. The gas was discharged through the gas exhaust line 2110 while the entire reaction chamber was kept at 1 atm. Then, the substrate temperature was set at 550° C. and thereafter the electric furnace was activated to retain the temperature of the source material at 700° C., thereby evaporating the source material. After the reaction was carried on for one hour, the temperature was decreased and the substrate was taken out.

The substrate taken out was observed with FE-SEM (Field Emission-Scanning Electron Microscope) and it was verified from the observation that acicular crystals of ZnO, as shown in FIG. 5A, were grown entirely on the substrate surface. At this time thicknesses of the acicular crystals were 20 to 200 nm and thicknesses of the acicular crystals were a little thicker near the roots thereof than near the distal ends thereof. Lengths of the acicular crystals were 5 to 20 μm. Therefore, aspect ratios of the acicular crystals were in the range of 25 to 1000.

Experiments were conducted with variations in the temperature of the substrate, the temperature of the source material, the concentration of oxygen, and the pressure inside the reaction chamber on the basis of the above conditions, and it was verified from the experiments that satisfactory acicular crystals of ZnO having the diameter of not more than 200 nm and the aspect ratio of not less than 100 were obtained under the conditions that the temperature of the gas in the vicinity of the substrate was in the range of 400 to 900° C., the temperature of the substrate in the range of not less than 400° C. nor more than 650° C., the temperature of the source material in the range of not less than 600° C. nor more than 800° C. the partial pressure of oxygen in the vicinity of the substrate in the range of 100 to 10000 Pa, and the pressure of the reaction chamber in the range of not less than 1000 Pa nor more than 100000 Pa. At this time 70% or more of the acicular crystals of ZnO were grown normally at angles of not less than 60° from the substrate.

When x was varied in the source material of $ZnO_x$ used, the temperature necessary for the evaporation increased with increase of x, and with x as small as near 0 the evaporation sometimes became unstable. As a consequence, it was found that it was feasible to grow the satisfactory acicular crystals of ZnO when x was not more than 0.5.

Example 8

The present example illustrates an example using water vapor as the oxidizing gas. As in Example 7. 0.5 g of the source material of $ZnO_x$ was charged into the receptacle 2102 in the reactor shown in FIG. 8 and a sintered alumina substrate was set as the substrate 2103. After that, the entire reactor was evacuated down to 1 Pa or less through the gas exhaust line 2110. Then, nitrogen gas was first introduced through the gas inlet line 2105 to set the reactor to 1 atm. Then, nitrogen was introduced at the rate of 100 mL/min through the gas inlet line A 2108 and nitrogen gas containing water vapor at 500 Pa was introduced at the rate of 100 mL/min through the gas inlet line B 2109. The gas was discharged through the gas exhaust line 2110 while the entire reactor was kept at 1 atm. After the temperature of the substrate was set at 550° C., the electric furnace was activated to maintain the temperature of the source material at 700° C., thereby evaporating the source material. After the reaction was carried on for one hour, the temperature was decreased and the substrate was taken out.

The substrate taken out was observed with FE-SEM and it was verified from the observation that a number of acicular crystals of ZnO having diameters of 20 to 200 nm and lengths of 1 to 10 μm were grown from the substrate surface as in Example 7.

Example 9

The present example illustrates an example in which ZnO is grown on a substrate with surface unevenness. The substrate used herein was one obtained by evaporating a film of $SnO_2$ about 0.5 μm thick on a glass substrate. This $SnO_2$ film had an unevenness formed in the surface during film formation and the unevenness had the heights and widths of about 0.1 to 0.5 μm and the shape as shown in FIG. 6A.

As in Example 7, 0.5 g of the source material of $ZnO_x$ was charged into the receptacle 2102 in the reactor shown in FIG. 8 and the above-stated glass substrate with the $SnO_2$ film was set as the substrate 2103. After that, the acicular crystals of ZnO were grown in the same manner as in Example 7.

The substrate taken out was observed with FE-SEM and it was verified from the observation that a number of acicular crystals of ZnO having diameters of 20 to 200 nm and lengths of 1 to 10 μm were grown from the substrate surface as in Example 7, the growth density was 50% or more greater than in Example 7, and 50% or more of the acicular crystals were grown from projections of the $SnO_2$ film on the substrate surface as shown in FIG. 6A.

Example 10

The present example illustrates an example in which ZnO is grown on a substrate with seed crystals of ZnO.

First described is a method of producing seed crystals on a substrate. The substrate employed herein was one obtained by evaporating an F-doped $SnO_2$ film about 0.1 μm thick on a glass substrate. This substrate was immersed in 2 mmol/L aqueous solution of zinc nitrate heated to 85° C., and a potential of −1.2 V was applied thereto for 2000 seconds under the Zn counter electrode and the reference electrode As a result, fine particles of ZnO were grown in the c-axis orientation and in the size of diameters of 0.1 μm and heights of 0.2 to 0.5 μm on the substrate. The density of the fine particles was about $10^9$ particles/cm$^2$.

As in Example 7, 0.5 g of the source material of $ZnO_x$ was then charged into the receptacle 2102 in the reactor shown in FIG. 8 and the above glass substrate with ZnO seed crystals was set as the substrate 2103 After that, acicular crystals of ZnO were grown in the same manner as in Example 7.

The substrate taken out was observed with FE-SEM and it was verified from the observation that a number of acicular crystals of ZnO having diameters of about 100 nm and lengths of 5 to 15 μm were grown in a state reflecting the seed crystals from the substrate surface. The growth direction was approximately normal to the substrate and the density of the acicular crystals was about $10^9$ particles/cm$^2$, which was approximately equal to the surface density of the seed crystals.

Experiments were conducted with variation in the density of seed crystals and it was found from the experiments that growth of acicular ZnO crystals reflecting the seed crystals was observed when the surface density of the seed crystals was seen in the range of $10^8$ to $10^{12}$/cm$^2$.

Example 11

The present example illustrates an example in which the present invention is applied to a dye-sensitized photoelectric conversion element.

First, acicular crystals of ZnO were grown on an F-doped SnO$_2$ film on a glass substrate in the same manner as in Example 10. However, the SnO$_2$ film had the thickness as thick as about 0.5 μm and the sheet resistance of the SnO$_2$ film was lowered to about 10 Ω/□.

Then, this substrate was annealed at 450° C. for one hour with oxygen gas flowing at 100 sccm, and then the temperature was reduced down to 80° C. This substrate was taken out and, before noticeable decrease of temperature, it was immersed and retained for 30 minutes in distilled ethanol in which Ru((bipy)(COOH)$_2$)$_2$(SCN)$_2$ as an Ru complex was dissolved. As a result, the dye was adsorbed on the surfaces of acicular crystals of ZnO. Then, a cell was produced using an electrode obtained by depositing a platinum film of 1 nm on a conductive glass (F-doped SnO$_2$, 10 Ω/□) by sputtering, as the counter electrode and using I$^-$/I$_3^-$ as the redox pair. The solution used was a mixture in which the solute of the redox was tetrapropylammonium iodide (0.46 M) and iodine (0.06 M) and the solvent was ethylene carbonate (80 vol %) and acetonitrile (20 vol %). This mixture was placed between the counter electrode and the substrate with the acicular crystals of ZnO grown thereon, thus forming the cell.

As a comparative example, a cell was fabricated in the same manner, using a substrate coated with TiO$_2$ powder having particle diameters of about 20 nm and containing anatase TiO$_2$ as a main component, and then sintered.

Then, the cells were exposed to light from the xenon lamp of 500 W equipped with the UV cut filter and measurement was conducted to measure values of photocurrent due to photoelectric conversion reaction. It was found from the measurement that the cell of the present invention demonstrated the increase of about 15% in the photoelectric conversion quantity per unit dye, as compared with the cell of the comparative example.

What is claimed is:

1. A method of producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein an unevenness as a crystal nucleation site is formed in a surface of the substrate.

2. A method producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein a conductive layer is formed on a surface of the substrate.

3. A method according to claim 2, wherein the conductive layer is a transparent electrode.

4. A method of producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein the first temperature is not less than 500° C. nor more than 1000° C. and the second temperature is not less than 400° C. and is less than 1000° C.

5. A method of producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein seed crystals are formed on a surface of the substrate prior to the deposition of the crystal constitutive material on the substrate.

6. A method producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein the metal or the inorganic compound is zinc powder with an oxide film on a surface thereof, Ti powder with an oxide film on a surface thereof, tungsten, or molybdenum.

7. Oxide whisker produced by the method as set forth in any one of claims 1 to 6, wherein a rate of axes of the oxide whiskers being not less than 60° relative to the substrate is not less than 70%.

8. The oxide whiskers according to claim 7, wherein the diameters of the oxide whiskers are not less than 5 nm nor more than 10 μm and a ratio of a length to a diameter of the oxide whiskers is not less than 10.

9. Oxide whiskers produced by the method as set forth in any one of claims 1 to 6, wherein ultrafine particles of an oxide are dispersed on a surface of the crystal.

10. The oxide whiskers according to claim 9, wherein the diameters of the oxide whiskers are not less than 5 nm nor more than 10 μm and a ratio of a length to a diameter of the oxide whiskers is not less than 10.

11. The oxide whiskers according to claim 9, wherein the particle diameters of the ultrafine particles of the oxide on the oxide whiskers are not less than 1 nm nor more than 100 nm.

12. A method of producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein a source material comprising Zn as a main component is evaporated at the first temperature and transported onto the substrate placed in an atmosphere containing oxygen, and whisker of ZnO having an average diameter of not more than 300 nm and an aspect ratio of not less than 50 and extending in the c-axis direction are formed on the substrate.

13. The method according to claim 12, wherein a particle pressure of oxygen or a partial pressure of water vapor in the vicinity of the substrate is 100 to 10000 Pa and a temperature of the atmosphere in the vicinity of the substrate is 400 to 900° C.

14. The method according to claim 12, wherein a pressure on the substrate is not less than 1000 Pa nor more than 100000 Pa.

15. The method according to claim 12, wherein a partial pressure of oxygen in the vicinity of an evaporating portion of the source material is lower than the partial pressure of oxygen in the vicinity of the substrate.

16. The method according to claim 12, wherein an average composition of the source material is represented by $ZnO_x$, where $0 \leq x \leq 0.5$.

17. The method according to claim 12, wherein an evaporation temperature of the source material is not less than 600° C. nor more than 800° C.

18. The method according to claim 12, wherein a temperature of the substrate is not less than 400° C. nor more than 650° C.

19. The method according to claim 12, wherein a minimum diameter of the oxide whiskers is not more than 50 nm and an aspect ratio thereof is not less than 100.

20. The method according to claim 12, wherein axes of 70% or more oxide whiskers are not less than 60° relative to the substrate.

21. The method according to claim 12, wherein sites for crystal growth initiation are formed on a surface of the substrate.

22. The method according to claim 21, wherein the sites are seed crystals of ZnO.

23. The method according to claim 22, wherein the seed crystals are formed by plating.

24. The method according to claim 21, wherein the sites are projections comprised of a material different from ZnO.

25. The method according to claim 21, wherein a surface density of the sites is not less than $10^8/cm^2$ and not more than $10^{12}/cm^2$.

26. The method of producing oxide whiskers, comprising heating a source material comprising a metal or an inorganic compound at a first temperature to be vaporized and depositing a crystal constitutive material vaporized from the source material on a substrate heated at a second temperature lower than the first temperature, wherein an average composition of the source material is represented by $ZnO_x$, where $0 \leq x \leq 0.5$.

27. A method of producing oxide whiskers comprising: heating a source material comprising a metal or an inorganic compound at a first temperature to cause vaporization and growing on a substrate said oxide whiskers from the vaporization source material, wherein said substrate is at a second temperature lower than the first temperature.

* * * * *

UNITED STATES PATENT AND TRADEMARK OFFICE
CERTIFICATE OF CORRECTION

PATENT NO. : 6,596,078 B2
DATED : July 22, 2003
INVENTOR(S) : Kaoru Konakahara et al.

It is certified that error appears in the above-identified patent and that said Letters Patent is hereby corrected as shown below:

Title page,
Item [56], References Cited, FOREIGN PATENT DOCUMENTS, "JP 6597 1/1975" should read -- JP 50-6597 1/1975 --.
Delete "JP 120518 9/1981"
"JP 5529 2/1985" should read -- JP 60-5529 2/1985 --.
"JP 252600 10/1989" should read -- JP 1-252600 10/1989 --.
"JP 239300 9/1996" should read -- JP 8-239300 9/1996 --.
"JP 316428 12/1998" should read -- JP 10-316428 12/1998 --.

Column 1,
Line 9, "intention" should read -- invention --.

Column 6,
Line 61, "call" should read -- can --.

Column 8,
Line 48, "50 nM" should read -- 50 nm --.

Column 11,
Line 43, "$I^-/I^{31}$." should read -- $I^-/I_3^-$. --.
Line 64, "example" should read -- example. --.

Column 13,
Line 67, "7." should read -- 7, --.

Column 14,
Line 56, "electrode" should read -- electrode. --.

UNITED STATES PATENT AND TRADEMARK OFFICE
CERTIFICATE OF CORRECTION

PATENT NO. : 6,596,078 B2
DATED : July 22, 2003
INVENTOR(S) : Kaoru Konakahara et al.

It is certified that error appears in the above-identified patent and that said Letters Patent is hereby corrected as shown below:

Column 16,
Line 63, "particle" should read -- partial --.

Signed and Sealed this

Thirteenth Day of April, 2004

JON W. DUDAS
*Acting Director of the United States Patent and Trademark Office*